| 
US008085383B2

(12) United States Patent
Hult

(10) Patent No.: US 8,085,383 B2
(45) Date of Patent: Dec. 27, 2011

(54) SYSTEM, METHOD, AND APPARATUS FOR SCANNING DETECTOR FOR FAST AND FREQUENT ILLUMINATION UNIFORMITY CORRECTION MODULE

(75) Inventor: David A. Hult, Danbury, CT (US)

(73) Assignee: ASML Holding N.V., Veldhoven (NL)

(*) Notice: Subject to any disclaimer, the term of this patent is extended or adjusted under 35 U.S.C. 154(b) by 745 days.

(21) Appl. No.: 11/259,088

(22) Filed: Oct. 27, 2005

(65) Prior Publication Data
US 2007/0097345 A1 May 3, 2007

(51) Int. Cl.
*G03B 27/72* (2006.01)
*G03B 27/54* (2006.01)
(52) U.S. Cl. ............................ 355/69; 355/67
(58) Field of Classification Search ............... 355/53, 355/67–71; 250/548; 356/399–401
See application file for complete search history.

(56) References Cited

U.S. PATENT DOCUMENTS 4,234,251 A * 11/1980 Nishida et al. ............... 355/74
5,532,497 A * 7/1996 Yasuzato et al. ............. 250/548
6,411,364 B1 * 6/2002 Suzuki ........................... 355/53
6,542,223 B1 4/2003 Okazaki
7,324,187 B2 * 1/2008 Tsuji et al. .................... 355/68
2003/0067591 A1 * 4/2003 Komatsuda .................. 355/67
2005/0110972 A1 * 5/2005 Tsuji et al. .................... 355/67

FOREIGN PATENT DOCUMENTS

| JP | 63-070419 A | | 3/1988 |
| JP | 7-161615 A | | 6/1995 |
| JP | 10-106942 A | | 4/1998 |
| JP | 2001-044111 A | | 2/2001 |
| JP | 2001-203141 A | | 7/2001 |
| JP | 2001-203141 A | * | 7/2001 |
| JP | 2005-109304 A | | 4/2005 |

OTHER PUBLICATIONS

Notice of Reasons for Rejection mailed Oct. 14, 2009 for Japanese Patent Application No. 2006-289130, 3 pgs.
English-Language Abstract for JP 2001-203141 A, published Jul. 27, 2001; 1 page.
English-Language Translation of Decision of Rejection directed to related Japanese Patent Application No. 2006-289130, mailed on Oct. 13, 2010, from the Japanese Patent Office; 2 pages.

* cited by examiner

*Primary Examiner* — Hung Henry Nguyen
(74) *Attorney, Agent, or Firm* — Sterne, Kessler, Goldstein & Fox P.L.L.C.

(57) ABSTRACT

Provided is a reticle masking blade system, including a reticle-masking blade device. Also included is a detector array mounted on an edge of a blade of the blade device.

15 Claims, 9 Drawing Sheets

SYSTEM, METHOD, AND APPARATUS FOR SCANNING DETECTOR FOR FAST AND FREQUENT ILLUMINATION UNIFORMITY CORRECTION MODULE

BACKGROUND OF THE INVENTION

1. Field of the Invention

The present invention relates to lithography. More specifically, the present invention relates to corrections in illumination uniformity of light sources in a lithography system.

2. Related Art

In a state-of-the-art projection lithography system, the exposure of light from the source optics is transmitted through, or reflected from, the patterned reticle and then imaged by projection optics onto the surface of a resist coated wafer. Modern lithography machines scan the wafer and the reticle synchronously to expose a full rectangular field. The reticle has an absorbing/reflecting layer, typically chrome, in the border area that surrounds the circuit pattern to prevent unwanted exposure of the wafer. Additionally, a state-of-the-art projection lithography system usually has movable reticle-masking blades that: (1) remove the need for having a wide (i.e., expensive) border area, (2) block light that might otherwise leak through pin holes in the border area, (3) allow a selected portion of the full patterned area to be exposed, and (4) selectively block reticle alignment targets so that they are not printed on the wafer.

Current uniformity correction modules are calibrated separately for each pupil shape within the lithography system. This process is prohibitively lengthy. For example, current estimates for the time required to calibrate finger positions within a uniformity correction module are about 5-10 minutes per pupil shape. During a particular calibration sequence, a lithography tool will store calibration data for more than 100 pupil shapes, which is the number of pupil shapes that might be required to perform a reasonably thorough calibration. Thus, based on these parameters, calibration of 100 pupil shapes could require 8-17 hours.

Instability within an illuminator portion of the lithography system, such as transmission hysteresis, contamination, beam wander, etc. on the order of between 1 hour and 1 year, degrades the quality of calibrations performed by the uniformity correction module. This instability creates the need for frequent recalibrations. Recalibrations, especially across multiple pupil shapes, reduce lithography system productivity. Contamination within the optical system portion of the lithography system, for example, could cause the illumination uniformity specification to be exceeded every 4 months.

Current uniformity sampling plans are either too coarse for the available correction mechanism or too dense for the time allowed for calibration. Coarse sampling reduces calibration accuracy. Dense sampling reduces system productivity.

Calibration software for the uniformity correction module exists but has become very complex. Further, execution times of the finger positioning techniques have become prohibitive. Also, data storage has become another significant factor related to the complexity of the calibration software.

What is needed, therefore, is a calibration method and device that will overcome the deficiencies in conventional systems. More specifically, what is needed is a calibration system that facilitates profile measurement during every exposure field. What is also needed is a uniformity control technique with intensity-based feedback to use in commanding moves of uniformity correction module finger positions to facilitate fine-tuning the finger positions.

SUMMARY OF THE INVENTION

Consistent with the principles in the present invention as embodied and broadly described herein, the present invention includes a reticle masking blade system, including a reticle-masking blade device. Also included is a detector array mounted on an edge of a blade of the blade device.

An exemplary embodiment of the present invention includes a linear detector array mounted onto a scanning blade in a field framing subsystem of a lithography system. The detector array scans through an exposure slit, measuring the intensity of the slit immediately prior to or following each exposure. Measured profiles can be used to provide intensity-based feedback to the uniformity control software that will command mechatronic moves within the uniformity correction module (finger positions) in order to modify the profile toward the target profile.

Periodic mapping of the proposed detector array to a detector at the wafer plane allows any detector signature, detector instability, and contamination within the optical system (downstream from the proposed detector array) to be deterministically compensated.

In the exemplary embodiment noted above, a slit measurement is provided for every exposure (field). This slit allows the lithographer one indication of process control during the exposure of a product. This also provides the uniformity control software with intensity-based feedback to use in commanding moves of the uniformity correction module positions, essentially fine-tuning the position settings with every exposure.

Furthermore, the profile measurements become faster and more frequent (with little or no time penalty other than detector mapping), thus eliminating the need for finger position calibrations for each pupil shape separately.

When uniformity correction module finger positioning is based on fast and frequent profile measurements, the software need not include sophisticated models and algorithms, nor store numerous large calibration files. This simpler software runs significantly faster than the software executed within conventional systems.

Further embodiments, features, and advantages of the present invention, as well as the structure and operation of the various embodiments of the present invention, are described in detail below with reference to the accompanying figures.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Figure 1:
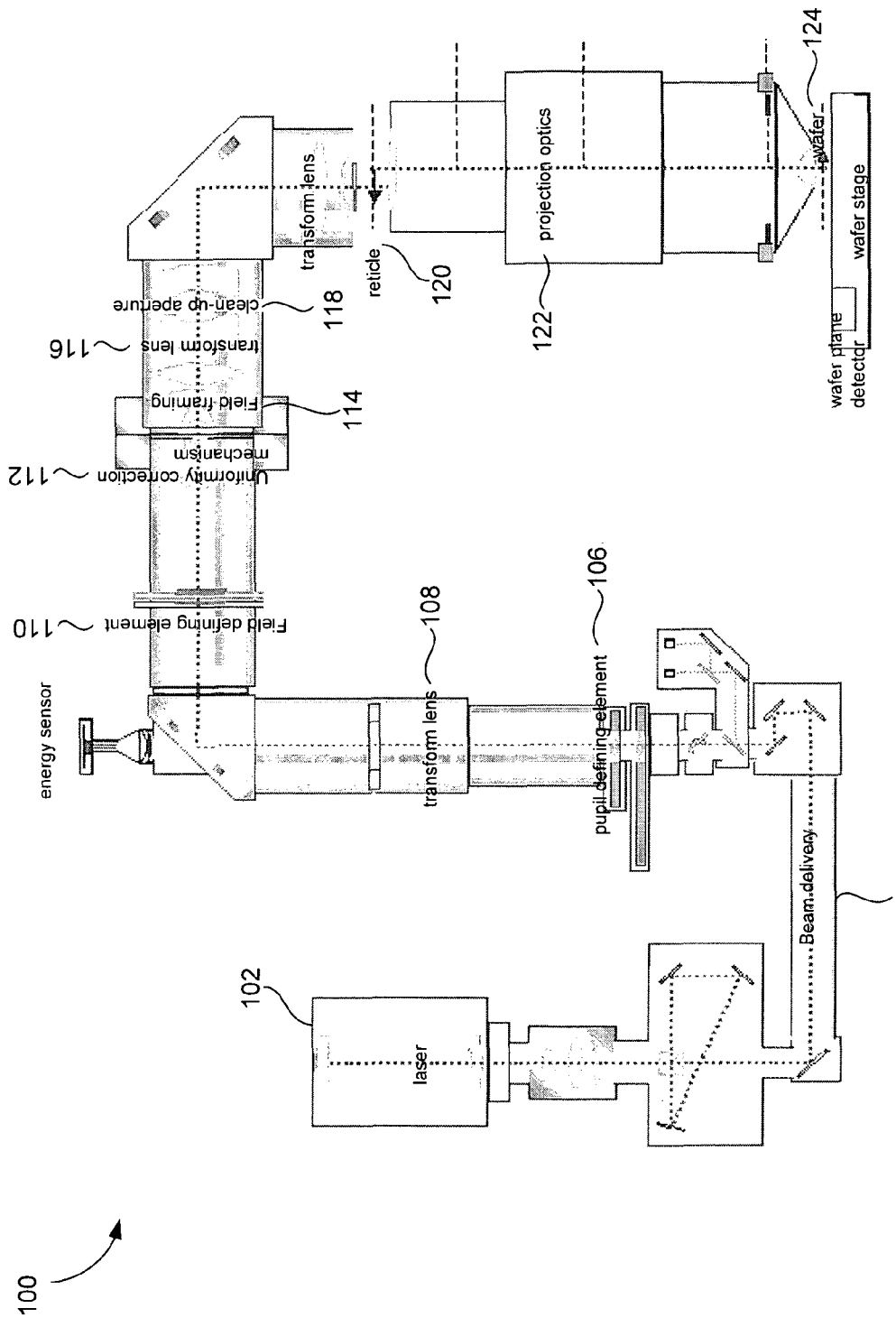
FIG. 1 is a high level overview of an exemplary lithography system constructed in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It will be apparent to one of skill in the art that the present invention, as described below, may be implemented in many different embodiments of hardware, software, firmware, and/or the entities illustrated in the drawings. Any actual software code with the specialized controlled hardware to implement the present invention is not limiting of the present invention. Thus, the operation and behavior of the present invention will be described with the understanding that modifications and variations of the embodiments are possible, given the level of detail presented herein.

FIG. 1 is a high level overview 100 of an exemplary lithography system constructed in accordance with an embodiment of the present invention. In FIG. 1, the lithography system 100 includes a light source 102, such as an excimer laser or some other suitable illumination mechanism. The light source 102 produces, for example, a light beam and projects the light beam to the rest of the lithography system 100 via a beam delivery system 104.

A pupil defining element 106 is used to spread and/or diverge the light beam to create a desired pupil shape. More specifically, the pupil defining element 106 provides a distribution of light about a range of angles (i.e., a pupil) in order to properly illuminate a reticle. A transform lens 108 cooperates with the pupil defining element 106 to create a desirable pupil shape.

The lithography system 100 also includes a field defining element 110. The field defining element 110 can include, as an example, an array of micro-lenses, and is desirably placed at a pupil of the lens to ultimately define the field shape. For example, the field defining element 110 facilitates the dispersal of incident light (discussed more fully below) into a transform lens which projects it into a rectangular pattern at a focal plane of the lithography system 100.

As known in the art, uniformity correction systems, such as the system 112, are mechanical devices responsible for controlling intensity levels within the illumination beam within the lithography system 100.

The uniformity correction system 112, which removes light from particular parts of the illumination slit, can include traditional well known turn-key uniformity correction sub-systems for correcting illumination uniformity.

In the present invention, the uniformity correction system 112 is desirably positioned at or near a field plane or focal plane of the lithography system 100. The uniformity correction system 112 can include adjustable mechanical components such as blades (fingers) or filters to facilitate beam uniformity adjustment. Further functional details of uniformity correction systems are well known to those skilled in the art and need not be further explained herein.

Based upon the measurements internally performed by the uniformity correction system 112, correction parameters are created to correct illumination uniformity.

Through manipulation of the adjustable mechanical components within the uniformity correction system 112 (based upon the correction parameters), uniformity characteristics of the illumination beam can be changed. More specifically, the correction parameters provide details of how to change positions of the blades or filters in the uniformity correction system 112, or other uniformity correction systems, in order to achieve a desired illumination beam profile.

The illumination beam, having been calibrated and corrected for uniformity, is projected to a field framing unit 114. The field framing unit 114 is also desirably located at a field plane or a focal plane of the lithography system 100. The field framing unit 114 includes the reticle masking blades, noted above, and discussed more fully below. The reticle masking blades are used to define the edges of the pattern being transferred from reticle to wafer. More specifically, the reticle masking blades define which parts of the reticle are illuminated. In the present invention, for example, four reticle masking blades can be used to form the optical slit, where pairs of blades move along different axes to define the edges of a scanning field.

A reticle 120, whose functionality and structure are well known to those of skill in the art, is provided, along with projection optics 122. Finally, a photosensitive surface, such as is typically found on a wafer 124, is included onto which a pattern is written.

Figure 2:
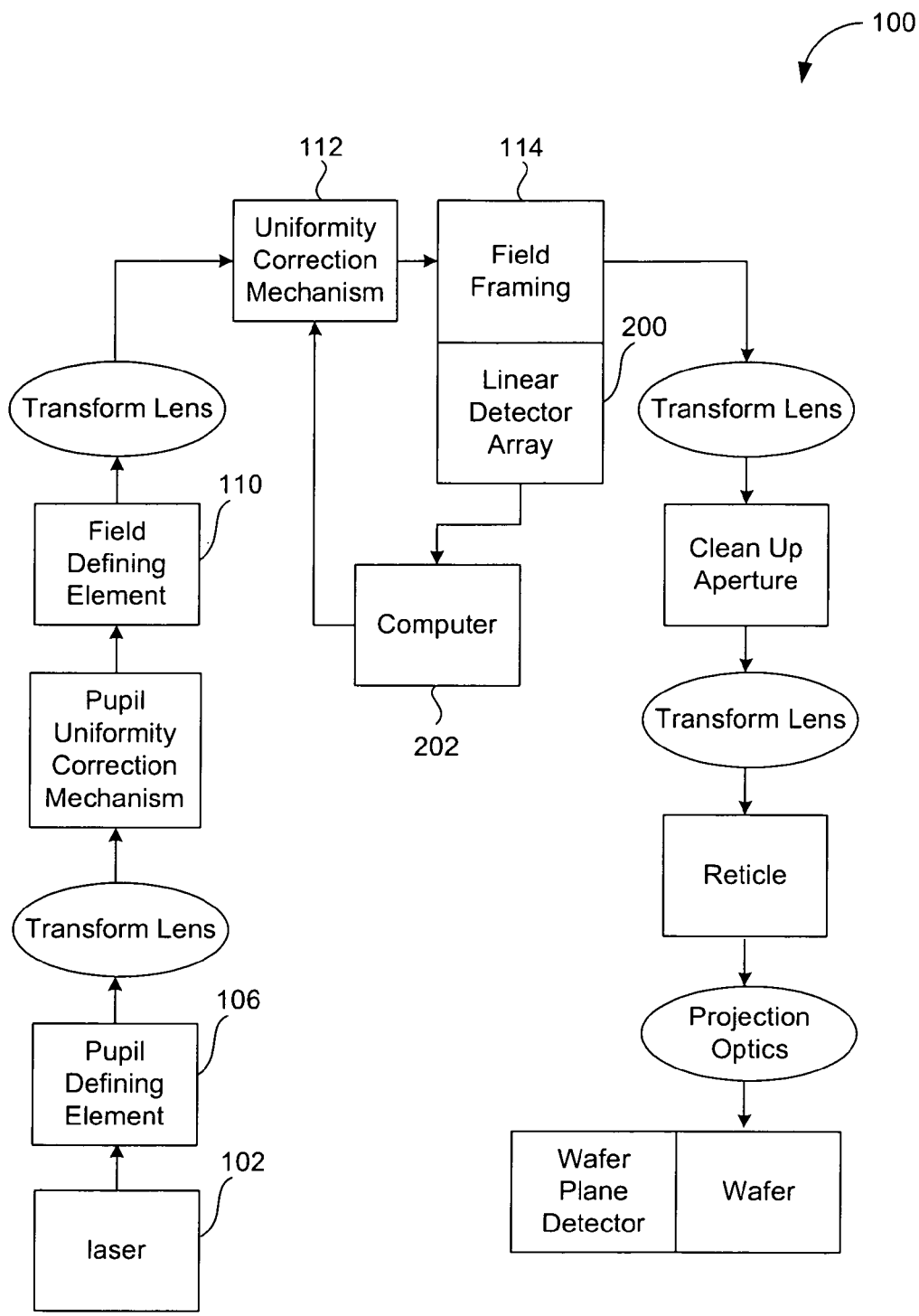
FIG. 2 is a block diagram illustration of the lithography system shown in FIG. 1.

FIG. 2 is a block diagram illustration of the lithography system 100 shown in FIG. 1. As shown in the block diagram of FIG. 2, a linear detector array 200 is attached to the field framing unit 114. A computer 202 receives an output from the linear detector array 200 and provides instructions to the uniformity correction mechanism 112 for calibrating the uniformity profile of the illumination beam. The detector array 200 can include, for example, one or more cameras. The computer 202 can include, for example, a uniformity processor analyzer module.

In the present invention, the linear detector array 200 is desirably mounted onto an active edge of one of the reticle masking blades of the field framing unit 114. After mounting onto the reticle masking blade, the detector array 200 can scan through the exposure slit, measuring the intensity of the illumination beam in the scan direction for every exposure. In the present invention, the intensity can be measured, in near real-time, on an exposure-by-exposure basis. Based upon these scans, the detector array 200 creates a measurement profile which is then used to provide the instructions to the uniformity control mechanism 112 via the computer 202. Control software, for example, within the uniformity correction mechanism 112, will command mechatronic moves to change the finger positions within the uniformity correction mechanism 112. These mechatronic moves modify the illumination beam profile toward a user selected target profile.

Figure 3:
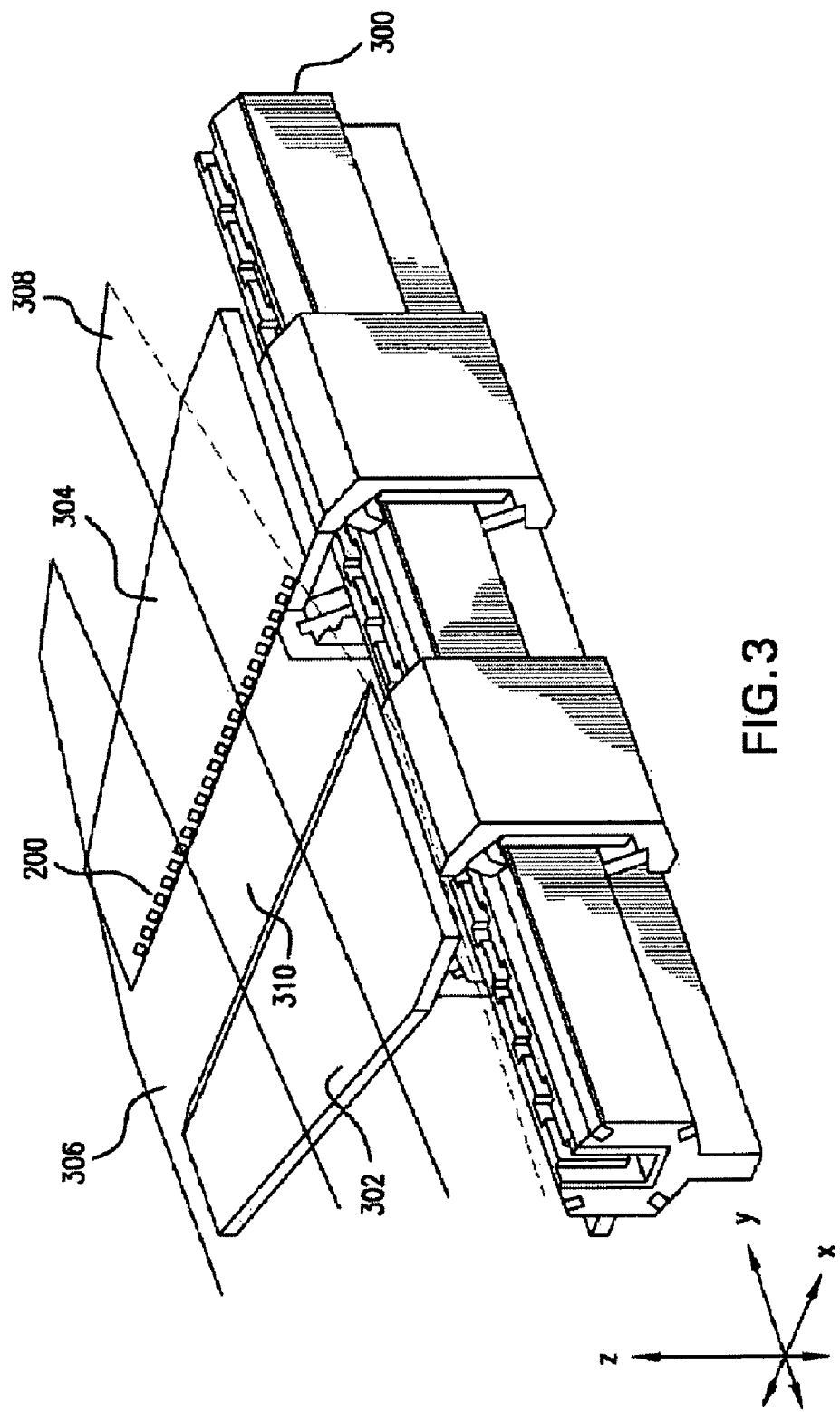
FIG. 3 is an illustration of exemplary reticle-masking blades used in the lithography system of FIG. 1.

FIG. 3 is a more detailed illustration of the reticle masking blades within the field framing unit 114, constructed in accordance with an embodiment of the present invention. FIG. 3 shows a reticle masking blade stage mechanism 300. Moveably attached to the reticle masking blade stage mechanism 300 are first and second parallel reticle masking blades 302 and 304. Also included are third and fourth reticle masking blades 306 and 308.

One or more driving mechanisms are configured to move the first and second reticle masking blades 302 and 304 along a y-axis and move the third and fourth reticle masking blades 306 and 308 along an x-axis. Although the reticle masking blades 306 and 308 can be capable of movement, their movement is not required in the present invention. Note: the y-axis is the scan axis.

Edges of the reticle masking blades 302/304 and 306/308 form an exposure slit 310. That is, horizontal edges of the blades 302/304 form a y-dimension of the exposure field 310 and vertical edges of the blades 306/308 form an x-dimension of the exposure field 310. As indicated in FIG. 3, the linear detector array 200, as an example, can be mounted on an active edge of one of the reticle masking blades 302 and 304, which moves along the y-axis.

Figure 3A:
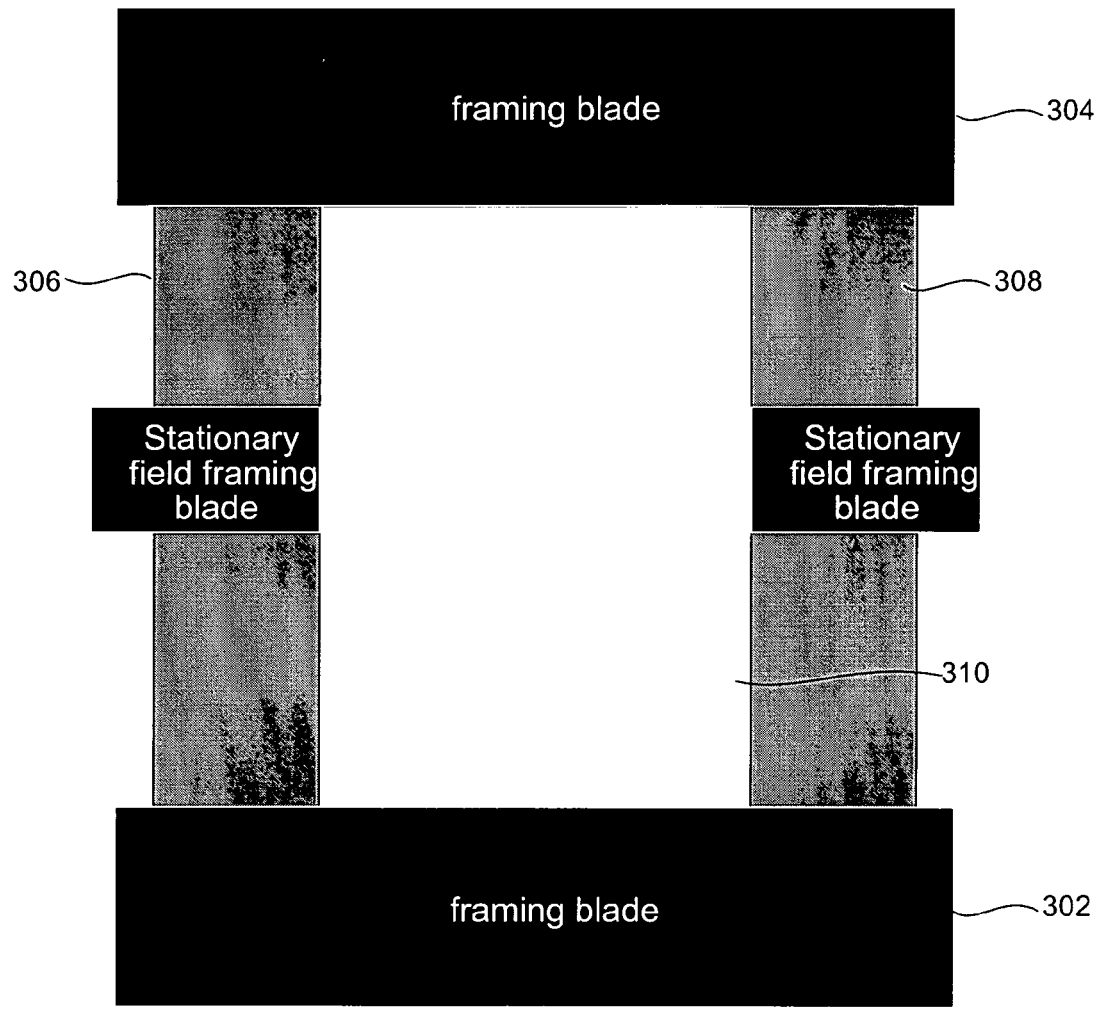
FIG. 3A is an illustration of a reticle framed by the reticle-masking blades illustrated in FIG. 3.

FIG. 3A provides a more detailed view of the relative positions of the reticle masking blades 302/304, scanning along the y-axis, the reticle masking blades 306/308, positioned along the x-axis, and the exposure field 310, formed therefrom. Although the reticle masking blades 306/308 are capable of movement along the x-axis, the present invention focuses primarily on the movement of the reticle masking blades 302/304 along the y-axis, for illustration purposes.

Figure 4:
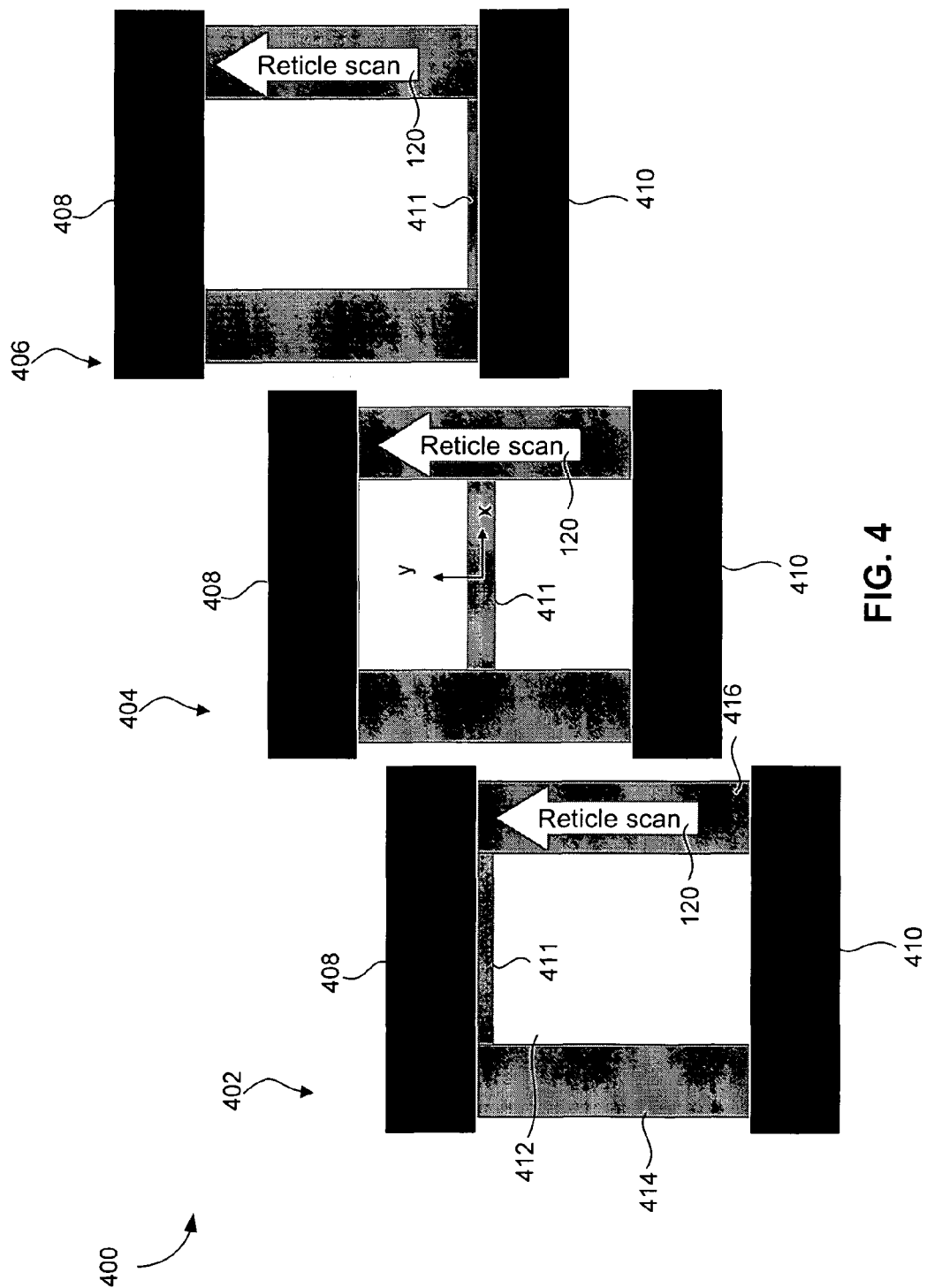
FIG. 4 is an illustration of a single reticle scan as the reticle and scanning blades (FIG. 3A) scan synchronously through the exposure slit shown in FIG. 3A in a conventional lithography system.

FIG. 4 is an illustration of a single reticle exposure as reticle and blades scan synchronously in the y-direction. At the start of a scan 402, reticle 120 and blade 408 are starting to allow a beam 411 to expose a pattern. As the scan continues 404, the beam 411 is fully within the pattern. Neither blade is blocking the light. As the scan continues further 406, the bottom blade begins to block the beam 411. The exposure of the pattern is shortly completed.

From a uniformity perspective, it is desirable that the scan integrated intensity within the slit of light (illumination beam) be uniform in the non-scanning direction (i.e., x direction) because energy from the beam is integrated in the scan direction during an exposure. Uniformity as described above, enables uniform exposure and superior process control.

During the first part of the exposure 402, for example, the exposure begins as the light beam 411 is partially (e.g., halfway) turned on. That is, a portion of the light 411 is blocked by an active edge of the reticle masking blade 408. Thus, during the first part of scan 402, the exposure begins as the blades 408/410 are scanning synchronously with the reticle 120. As shown, the blades 408/410 and blades 414/416 define the edges of the slit 412. For example, horizontal edges of the blades 408/410, positioned along the y-axis, define the y dimension of a field that is being printed.

During the ensuing exposure 404, the light beam 411 is completely on as the reticle 120 is scanning up. In other words, during the middle part of exposure 404, the light beam 411 is on the part of the reticle 120 that has the pattern to be printed. During this part of the exposure 404, for example, the top most reticle masking blade 408 is no longer blocking the light beam 411. Finally, during a third part of exposure 406 (at the end of the exposure), an active edge of the reticle masking blade 410 begins to block the light beam 411.

It is not essential that blades 408 and 410 scan synchronously with the reticle during the entire exposure. They need only be coincident with the pattern edge when crossing the beam, at the start 402 and end 406 of scan.

Figure 5:
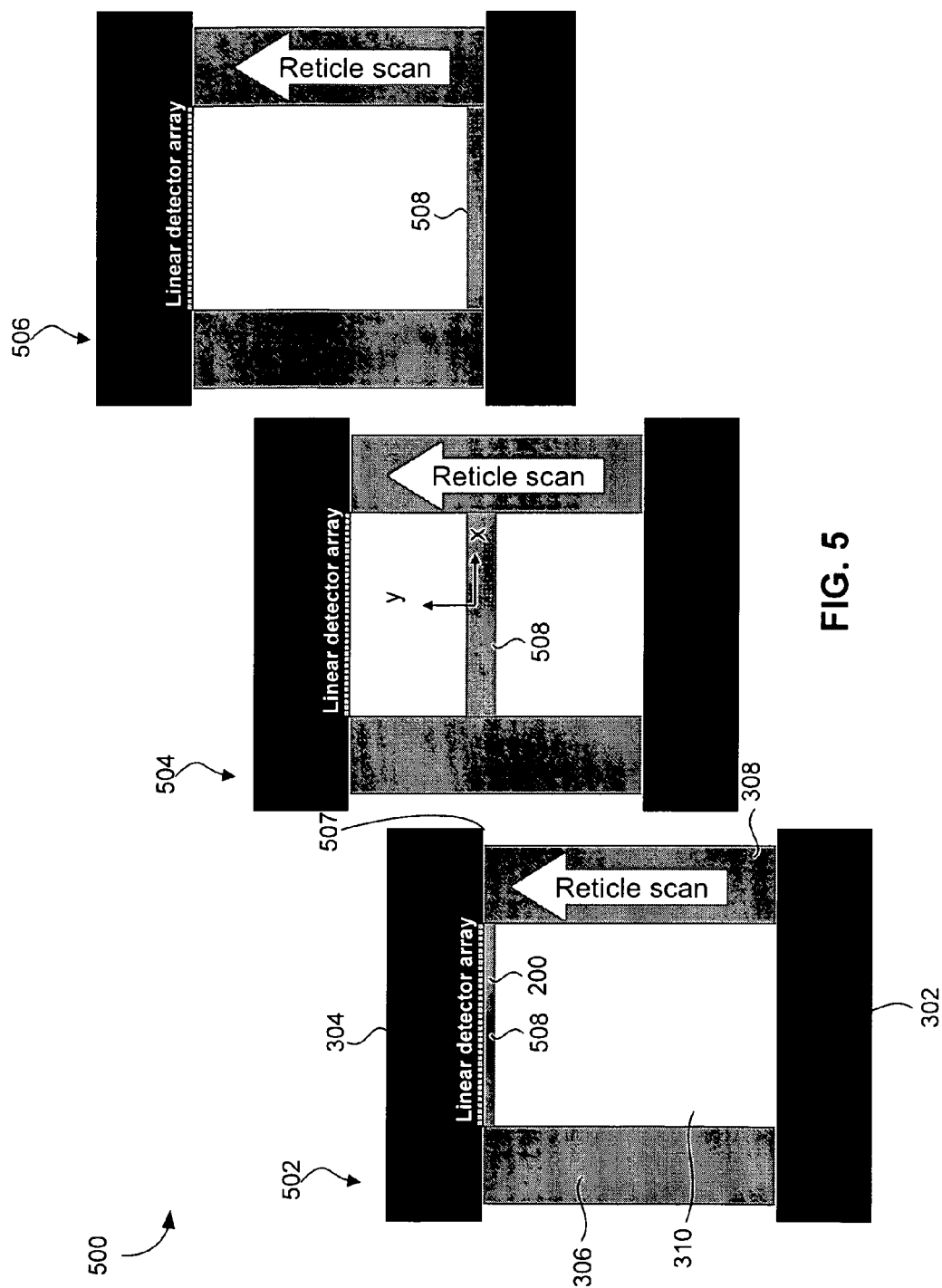
FIG. 5 is a duplication of FIG. 4 with the addition of a linear detector array attached to a reticle-masking blade in a lithography system constructed in accordance with an embodiment of the present invention.

FIG. 5 is an illustration of a single reticle exposure 500 of the field framing unit 114 constructed in accordance with an embodiment of the present invention. In FIG. 5, the linear detector array 200 is mounted, for example, on an active edge 507 of the reticle masking blade 304. By placing the linear detector array 200 on one of the reticle masking blades 302 or 304, scanning along the y-axis, the detector array 200 will be able to measure the entire illumination beam 508.

Figure 6:
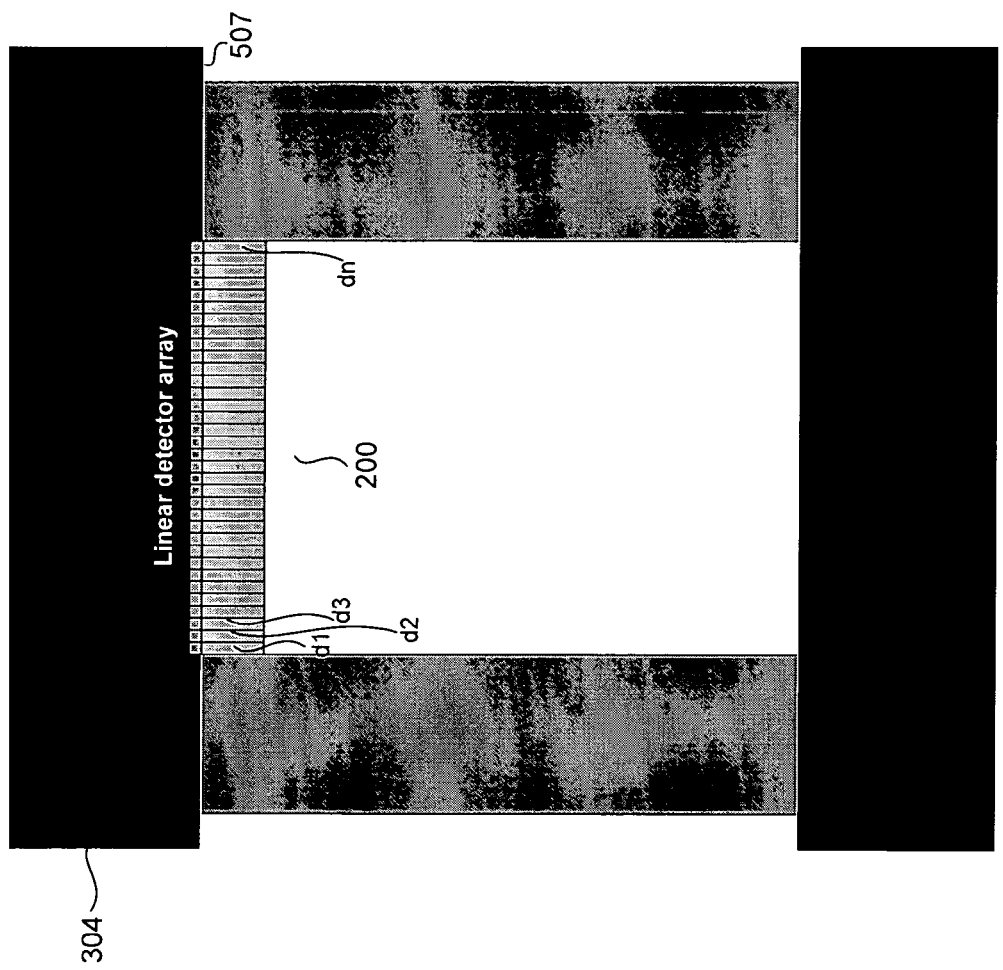
FIG. 6 is a more detailed illustration of the linear detector array shown in FIG. 5.

FIG. 6 is a more detailed view 600 of the linear detector array 200 positioned on the edge 507 of the reticle masking blade 304. As shown in FIG. 6, the linear detector array 200 includes a plurality of individual detectors d(1)-d(n). As the detector array scans through the slit 310, each of the detectors d(1)-d(n) is scanning through a respective portion of the illumination beam 508. Outputs of the individual detectors d(1)-d(n), within the detector array 200, can be summed to produce a scan integrated uniformity profile of the illumination beam 508. This profile can then be analyzed and the resulting instructions can be fed back to the uniformity correction mechanism 112 (see e.g., FIG. 2). Uniformity corrections are thus made to the slit 310.

Figure 7:
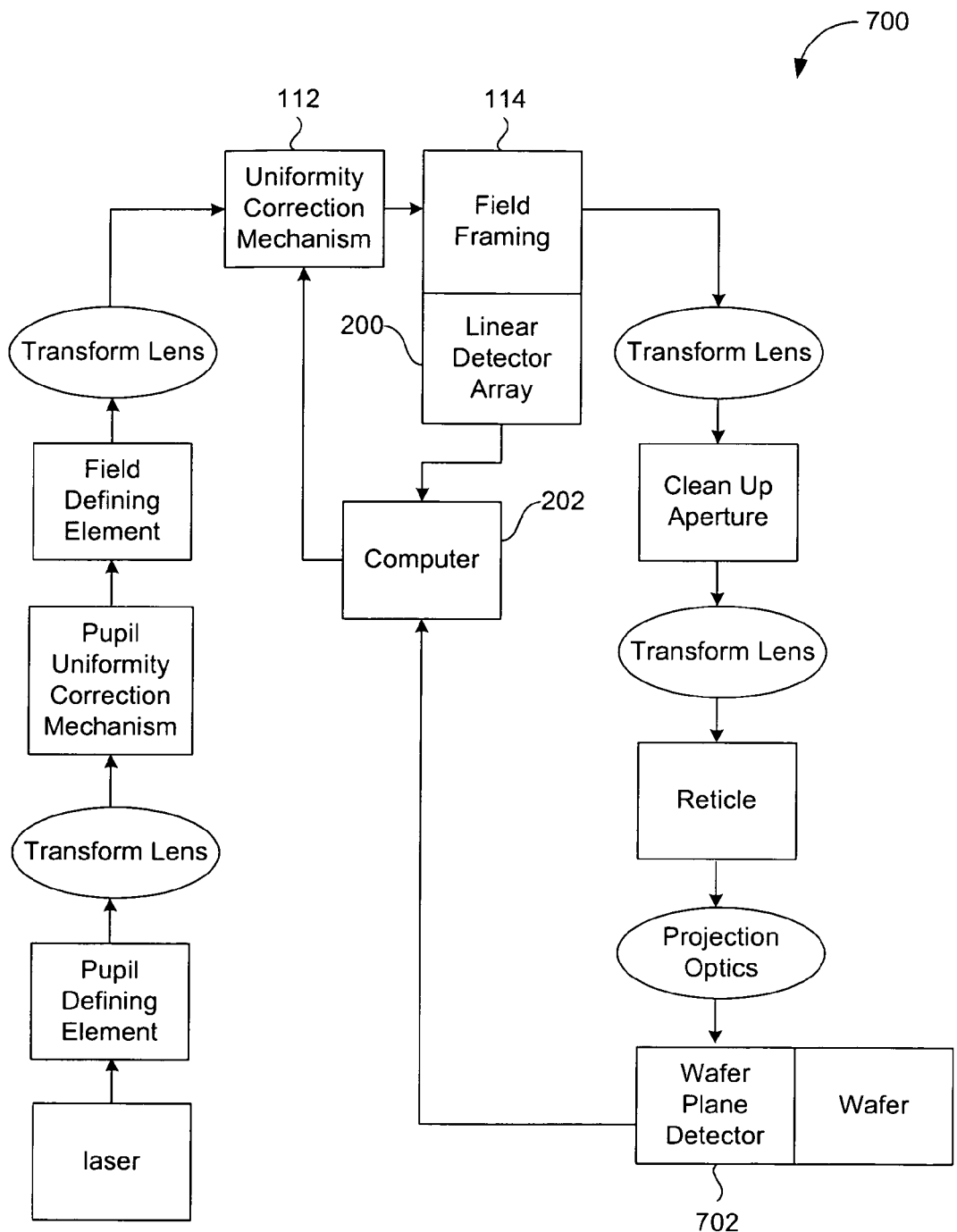
FIG. 7 is a block diagram illustration in which the detector mapping process is described.

FIG. 7 is a description of detector mapping process 700 of the present invention. While measurements are taken at reticle masking level during production exposures, uniform illumination at wafer level is actually the critical parameter. Differences exist between measurements taken at reticle masking and wafer levels. These differences result from optical transmission signatures from different optical elements between the reticle masking and wafer levels as well as differing detector responses from detector element to detector element. Mapping of detectors to each other is desirable in order to accurately infer uniformity at the wafer level based upon measurements taken at the reticle masking level.

In FIG. 7, a wafer plane detector 702 can be illuminated when an exposure is not occurring. By using the wafer plane detector 702, both the linear detector array 200 and the wafer plane detector 702 can be used to measure uniformity nearly simultaneously. The computer 202 can then analyze the ratio between measurements of the linear detector array 200 and measurements of the wafer plane detector 702 to produce a transfer function. The results of this analysis, and the resulting transfer function, can be applied to the uniformity measurements from the linear detector array 200 to help provide higher quality instructions for the control of the uniformity at wafer level.

Figure 8:
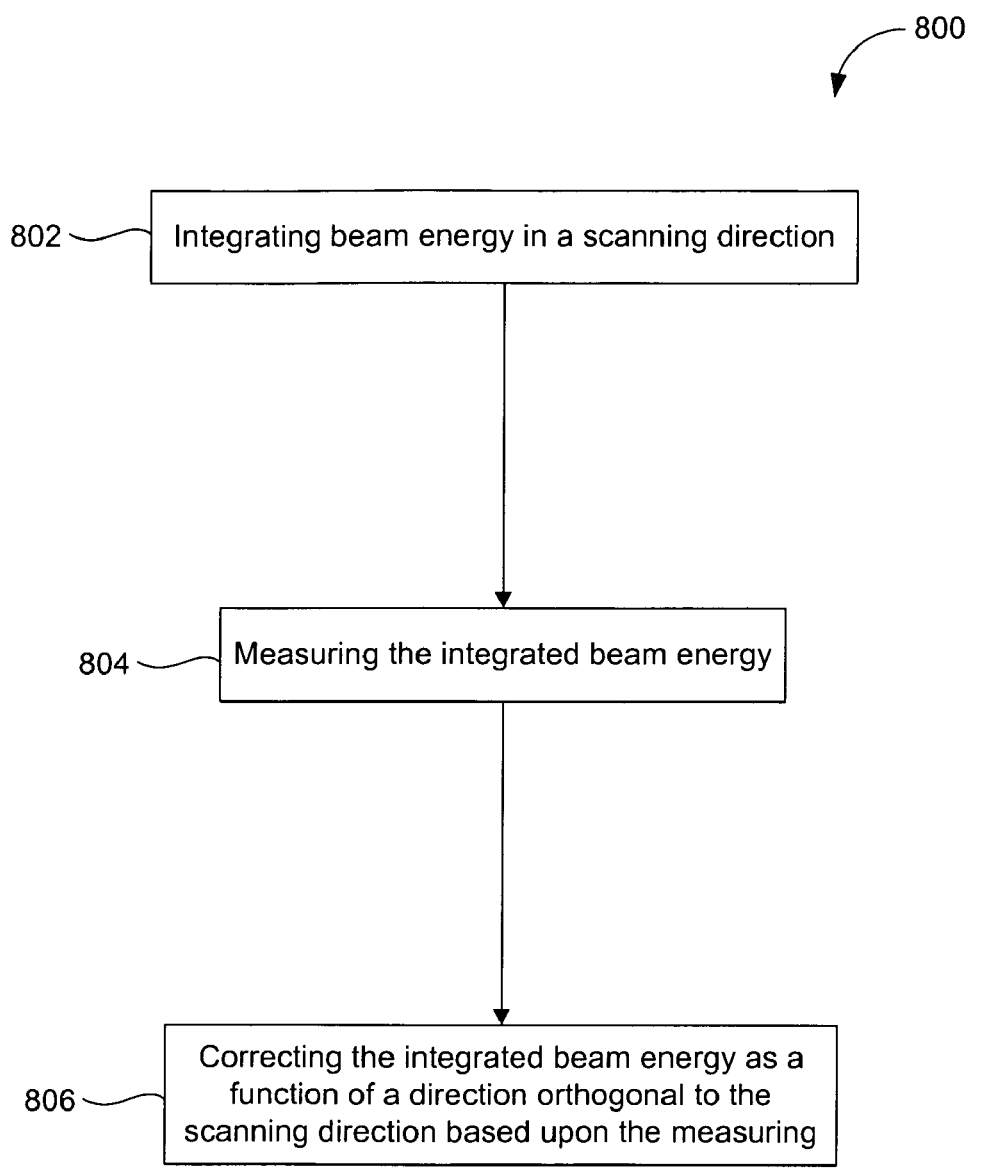
FIG. 8 is a flow diagram of an exemplary method of practicing an embodiment of the present invention.

FIG. 8 is a flow diagram of an exemplary method 800 of practicing an embodiment of the present invention. In FIG. 8, a uniformity correction mechanism within a lithography system is integrated in a scanning direction, as indicated in step 802. The integrated intensity is measured in step 804. And in step 806, integrated beam energy is corrected as a function of a direction orthogonal to the scanning direction based upon the measurement of the integrated intensity.

CONCLUSION

The present invention facilitates uniformity profile measurements during every exposure (field) within a lithography system. This process provides a lithographer with at least a measure of process control during the exposure of product. The present invention also provides the uniformity control software with intensity-based feedback to use in commanding moves of the uniformity correction module finger positions, essentially fine-tuning the finger position calibrations with every exposure. When finger positioning is based on rapid and frequent profile measurements, complexities in the associated software can be minimized, speed increased, and storage of calibration files reduced.

While embodiments of the present invention have been described above, it should be understood that they have been presented by way of example only, and not limitation. It will be understood by those skilled in the art that various changes in form and detail may be made therein without departing from the spirit and scope of the invention as defined in the appended claims. Thus, the breadth and scope of the present invention should not be limited by the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination of one of ordinary skill in the art.

What is claimed is:

1. A reticle masking blade system, comprising:
   a reticle-masking blade device;
   a detector array that includes a plurality of detectors mounted on an edge of a blade of the blade device and configured to measure an intensity of an illumination beam using the plurality of detectors and integrate the intensity of the illumination beam measured by each of the plurality of detectors in a scanning direction to determine a measured integrated intensity of the illumination beam; and
   a uniformity correction mechanism coupled to the detector array and configured to correct the integrated intensity of the illumination beam in a direction orthogonal to the scanning direction based upon the measured integrated intensity of the illumination beam.

2. An apparatus including a field framing subsystem, comprising:
   a reticle-masking blade device within the field framing subsystem configured for scanning;
   a detector array that includes a plurality of detectors mounted on an edge of the reticle-masking blade device and configured to measure an intensity of an illumination beam using the plurality of detectors and integrate the intensity of the illumination beam measured by the plurality of detectors in a scanning direction to determine a measured integrated intensity of the illumination beam; and
   a uniformity correction mechanism coupled to the detector array and configured to correct the integrated intensity of the illumination beam in a direction orthogonal to the scanning direction based upon the measured integrated intensity of the illumination beam.

3. The apparatus of claim 2, wherein an edge of the reticle masking blade includes at least one from the group including an active edge, a leading edge, and a trailing edge.

4. The apparatus of claim 1, wherein the intensity is integrated only on an exposure-by-exposure basis.

5. The apparatus of claim 4, wherein the detector array includes one or more cameras.

6. The apparatus of claim 2, further comprising a measurement device coupled to the detector array and configured for measuring light between exposures.

7. The apparatus of claim 6, wherein the measuring occurs in near real-time.

8. The apparatus of claim 7, wherein the measurement device is configured to update the uniformity correction mechanism.

9. The reticle masking blade system of claim 1, wherein the detector array is a linear detector array.

10. The reticle masking blade system of claim 1, further comprising:
    a field framing unit, wherein the detector array is coupled to the field framing unit.

11. The reticle masking blade system of claim 1, further comprising:
    a computer to receive an output from the detector array and provide instructions to a uniformity correction module for calibrating a uniformity profile of an illumination beam to a target profile.

12. The reticle masking blade system of claim 11, further comprising:
    a detector having one or more detector elements at a wafer plane, wherein the computer is configured to periodically map one or more detector responses from the detector array to the detector elements.

13. The reticle masking blade system of claim 1, wherein the detector array is configured to scan through an exposure slit for measuring the intensity of an illumination beam across the exposure slit.

14. The apparatus of claim 2, further comprising:
    a wafer plane detector coupled to the uniformity correction mechanism and configured to measure uniformity of the illumination beam;
    wherein the uniformity correction mechanism is configured to compare the measured integrated intensity of the illumination beam by the detector array to the uniformity of the illumination beam measured by the wafer plane detector and correct the integrated intensity of the illumination beam based on the comparison.

15. The apparatus of claim 2, wherein an output of each individual detector of the array of detectors is summed to produce a scan integrated uniformity profile of the illumination beam.

* * * * *